(12) United States Patent
Schulze et al.

(10) Patent No.: US 6,270,947 B2
(45) Date of Patent: *Aug. 7, 2001

(54) METHOD AND APPARATUS FOR REDUCING NON-UNIFORMITY AREA EFFECTS IN THE MANUFACTURE OF SEMICONDUCTOR DEVICES

(75) Inventors: Steffen Schulze; Franz Zach, both of Wappingers Falls, NY (US)

(73) Assignees: Infineon Technologies AG, Munich (DE); International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/302,392

(22) Filed: Apr. 30, 1999

(51) Int. Cl.⁷ .................................................. G03F 7/20
(52) U.S. Cl. ........................ 430/312; 430/311; 430/396
(58) Field of Search ............................... 430/311, 22, 30, 430/396, 312

(56) References Cited

U.S. PATENT DOCUMENTS

| | | | |
|---|---|---|---|
| 3,582,215 | * 6/1971 | Loomis | 356/154 |
| 4,668,089 | * 5/1987 | Oshida et al. | 356/152 |
| 5,545,498 | * 8/1996 | Konno | 430/18 |
| 5,811,211 | * 9/1998 | Tanaka et al. | 430/30 |
| 5,894,056 | * 4/1999 | Kakizaki et al. | 430/5 |
| 6,027,843 | * 2/2000 | Kojima et al. | 430/30 |
| 6,040,096 | * 3/2000 | Kakizaki et al. | 430/5 |

\* cited by examiner

*Primary Examiner*—Kathleen Duda
(74) *Attorney, Agent, or Firm*—Stanton C. Braden

(57) ABSTRACT

The non-uniformity edge effect that can affect the quality of chips near the edge of a semiconductor wafer of various steps in the manufacture of integrated circuits is reduced. This is achieved by increasing the field area exposed by a step and repeat printer only when printing squares for chips located near the wafer edge. As a result there is also printed for processing an additional non-functional area outside the functional area to reduce the non-uniformity effect. This increases throughput of the printing apparatus.

4 Claims, 1 Drawing Sheet

METHOD AND APPARATUS FOR REDUCING NON-UNIFORMITY AREA EFFECTS IN THE MANUFACTURE OF SEMICONDUCTOR DEVICES

FIELD OF INVENTION

This invention relates to the manufacture of integrated circuit devices, and more particularly, to the manner in which patterns are printed on a semiconductive wafer to define how the wafer will eventually be diced to provide the individual chips in which the integrated circuits are formed.

BACKGROUND OF THE INVENTION

In the manufacture of integrated circuit devices, it is customary to do most of the processing of the devices on a wafer scale in a large wafer, typically many inches in diameter, and after such processing to dive the wafer into individual chips, each typically a square or rectangle in shape and a fraction of an inch on a side, for completion of the final steps of the processing, such as the provision of terminal connections and packaging.

Basic to the processing, is the water use of a step and repeat printer to print, in a layer of photoresist, the appropriate patterns of the various photoresist masks that are used to localize the effect of the many processing steps.

Generally the shape of the wafer being processed is circular, while the shape of the chips after dicing is essentially square or rectangular. Accordingly the area generally printed in each step generally is either a square or a rectangle. It will be convenient in this description to describe the area printed in each step as a square, although it is to be understood that this term as used here in, includes rectangular areas. Because the wafer is circular and the areas exposed by each step are square, there will be a width around the periphery (edge) of the wafer that, if printed, would yield incomplete squares that would be useless as chips. Additionally, there is a region around the wafer edge that is also useless because of a high density there of various forms of defects.

Moreover, presently in the manufacture of state of the art semiconductive devices there are numerous processes, such as electrochemical chemical polishing and some etching, that depend on substantial uniformity over large areas to provide uniform results over the area processed. With such processes, there tends to be a non-uniformity area effect that causes a difference in results with respect to complete squares close to the wafer periphery because of the discontinuity such periphery provides.

To counter these various edge effects, the step and repeat process is often extended to print squares that extend beyond the area free of such effects, even though it is known that these squares will not provide functional chips. Printing these non-functional squares extends the overall exposure time for printing of a wafer and so decreases the throughput of a given exposure machine. Because of the high cost of the exposure machines, this can be a significant extra expense factor in the manufacture of integrated circuits.

It is also a fact that many integrated circuit devices do not utilize the full exposure field of the equipment available. In particular some scanning equipment, such as deep-ultra violet printers, offer large exposure fields for printing chip squares that often cannot be fully used because the final product made has to fit closely the exposure field of tools, used for other processes in the manufacture, that have much smaller exposure fields.

Because of this, printing equipment now available typically includes provision for controlling the field exposure area of the step pattern or square by providing an exposure tool that controls the size of the area printed. This includes use of movable blades that can be adjusted to set the effective field exposure area of the printing reticle just to that needed for the square being printed. This setting generally remains fixed during the printing of a wafer.

The present invention employs a patterning strategy that better copes with the wafer edge problem described by use of the extra exposure area available in such printing equipment.

SUMMARY OF THE INVENTION

The basic strategy of the invention is to use the extra exposure field area generally available in step and repeat printing apparatus to print squares with enlarged patterned areas selectively near the wafer edge. These extend into the useless wafer edge region that will not normally yield useful chips. In particular, an improvement in efficiency is achieved by controlling the blades positioned on the exposure tool of the printer to increase selectively the opening that determines the size of the field area being exposed. When there is printed a square in a region of the wafer that normally would be useless because of the edge effects, the exposure tool selectively is opened wider so that a wider area of the reticle is opened and extra fill pattern is also being printed to include normally non-useable wafer edge area. The inclusion of such enlarged patterned area can be expected to reduce the non-uniformity area edge effect in subsequent vulnerable processing steps and improve the yield of useful chips. Squares of the smaller standard regular product pattern are printed in wafer regions free of the edge effect. As a result, in the case of a printer, although the printing time of such enlarged edge squares is slightly increased because of the extra area being exposed, this extra time should be much less than would have been required to print and process squares that included non-functional edge areas, as has been done in the past, to avoid the non-uniformity edge effect. The extra area included in the enlarged squares along the wafer edge is removed when the wafer is finally diced so that these chips are now of standard size, Viewed from one aspect, the present invention is directed to a method for the step and repeat printing of squares on a circular semiconductive wafer that comprises the step of adjusting the exposure tool used to control the field exposure area of each square printed to add extra exposure field area to the regular field area of the square selectively at squares exposed adjacent to an edge of the wafer, whereby there is ameliorated area non-uniformity effects in later processing steps of such squares. This extra exposure field area is eliminated when that enlarged square is diced so that there is formed therefrom a chip of the same size as the chips formed from the standard squares.

Viewed from another aspect, the invention is a step-and-repeat printing system that uses a printer with an exposure tool whose setting can be adjusted in the course of printing a product pattern on a wafer. This permits printing extra area of a reticle that is appropriately patterned . This extra pattern is printed in areas of the wafer where such printing can ameliorate the edge effect in later processing.

The invention will be better understood from the following more detailed description taken with the drawing.

DETAILED DESCRIPTION

Figure 1:
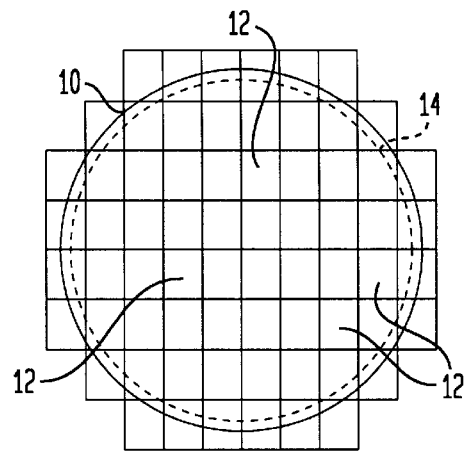
FIG. 1 shows a circular wafer patterned into standard squares and it will be helpful in explaining the wafer edge effect that the invention seeks to minimize.

FIG. 1 shows a circular wafer 10, typically a slice of monocrystalline silicon about 8 inches in diameter, over which are shown printed a series of squares 12 corresponding to the chips to be diced from the wafer 10. As seen, there are some incomplete squares that extend beyond the edge of the wafer 10 and so are non-functional. Additionally, there is a surplus edge region of the wafer 10 that cannot be used for chips, represented by that included within the dashed line 14. Squares that extend beyond the dashed line 14 are also not useable. In addition, there are also some squares that are wholly within the dashed line 14 but sufficiently close to the edge that they ordinarily would not be useable because of the non-uniformity area effects discussed above. The invention involves using the area outside the fully printed squares and within the dashed line 14 to reduce the non-uniformity large area effect on such chips.

Figure 2:
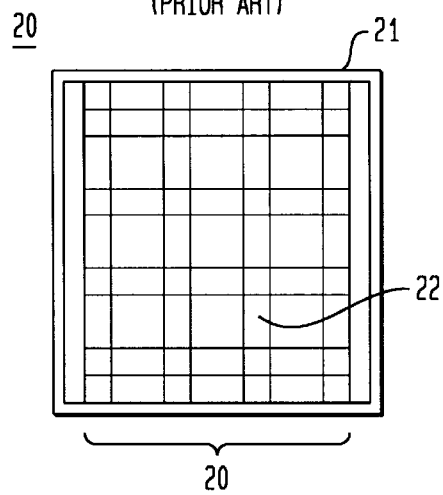
FIG. 2 shows a typical reticle for use in printing a desired exposure product pattern on a wafer.

FIG. 2 shows a typical reticle 20 for use in a conventional step-and-repeat printer used for patterning a standard all-functional square pattern. The reticle typically includes a frame 21 that is used to support the patterned mask 22 that typically is of a size to pattern an area corresponding to a single die into which the wafer will be diced after most of the wafer scale processing is done. Generally the reticle will be used with an exposure tool that comprises a set of blades that are adjusted to expose as much of the reticle as is needed for the size of the area being pointed. Generally this setting of the blades has been kept fixed for the printing of the entire wafer.

Figure 3:
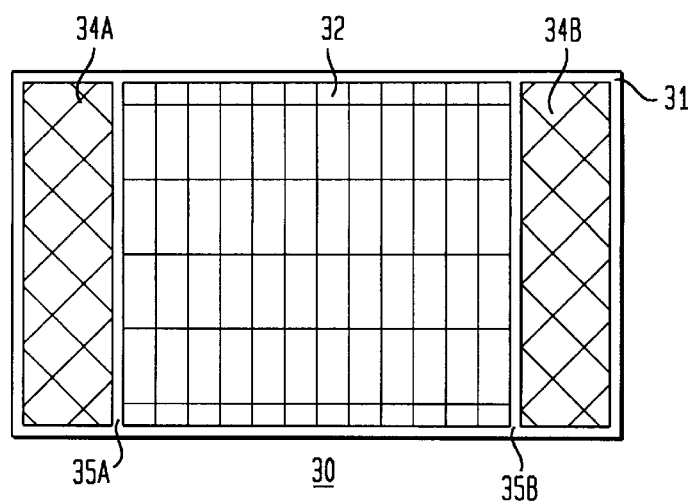
FIG. 3 shows an example of a reticle including the product pattern and an extra region of fill pattern for use selectively when printing squares on a die area that is close to a wafer edge, to extend the field area exposed into the surplus edge area of the wafer thereby to overcome the edge effect in later processing and to make such squares useful without the need for printing non-functional squares.

FIG. 3 shows a reticle 30 modified for use in the method of the invention. It includes a frame 31 that is used to support a patterned mask that includes a main section 32 and two auxiliary sections 34A and 34B that advantageously are spaced from the main section by narrow corridors 35A and 35B. Each square of the main section 32 corresponds to the area of a fully functional square that is to be printed in regions free of any edge effects, and when such squares are being printed, the blades of the exposure tool are set appropriately. Each auxiliary section is patterned 34A, 34B much in the manner of the main section but will be used to print non-functional edge regions. Such special areas of the reticle are shown cross-hatched. When the edges of the wafer are being printed, the setting of the exposure tool is increased to permit printing of these enlarged extra areas. The narrow unpatterned corridors 35A, 35B advantageously are used as guides to facilitate the dicing of the wafer and may sometimes be unnecessary.

In some instances, it may be advantageous to provide extra fill auxiliary sections along all four sides rather than two sides as shown. The exposure tool would then need to be modified appropriately. A software program would be used to change the blade settings appropriately.

It should be noted that there should be distinguished the situation where there may be printed on the periphery of the wafer patterns that are useful for alignment or testing proposes.

By this expedient, it becomes unnecessary to provide extra unusable squares to pattern non-functional areas to compensate for the non-uniformity area effect described. It is sufficient merely to use selectively larger squares when patterning squares at the wafer edge to overcome the non-uniformity area effect.

It is to be understood that the specific embodiment described is merely illustrative of the general principles. For example the invention should be useable with wafer shapes that are non circular. Similarly c pattern printed could have various shaped, and so the term "square" to denote the pattern area printed in each step is intended to be independent of the shape of the area being printed in each step.

What is claimed is:

1. A method for the step and repeat printing of a pattern of squares on a semiconductive wafer of a circular area comprising the steps of:

printing a pattern of squares of a first standard are a in regions of the wafer sufficiently remote from the periphery of the wafer to be essentially free of the edge effect. and printing a pattern of squares of an area larger than the standard area in regions of the wafer near the periphery of the wafer which are subject to the edge effect.

2. The method of claim 1 in which when the wafer is diced into chips, the squares of enlarged area at the periphery of the wafer are diced to form chips of the same size as those from squares of the standard area.

3. The method of claim 2 in which the printing of squares of standard area and of enlarged area is done in the same printing step and the changes in area is done by changing the size of the reticle opening in the course of the printing.

4. A method for obtaining from a wafer functional chips of a standard size in a process in which a circular wafer is printed with squares and in which the squares away from the periphery of the wafer that are essentially free of the edge effect, are printed to have a standard size and the squares printed at the periphery of the wafer that are subject to the edge effect, are printed to have a size larger than the standard size and then the wafer is diced uniformly to provide chips of the same size both from the squares printed of standard size and the squares printed of size larger than the standard size.

* * * * *